(12) United States Patent
Cheng

(10) Patent No.: US 8,661,390 B2
(45) Date of Patent: Feb. 25, 2014

(54) METHOD OF EXTRACTING BLOCK BINDERS AND AN APPLICATION IN BLOCK PLACEMENT FOR AN INTEGRATED CIRCUIT

(75) Inventor: Chihliang (Eric) Cheng, Fremont, CA (US)

(73) Assignee: Chihliang (Eric) Cheng, Fremont, CA (US)

( * ) Notice: Subject to any disclaimer, the term of this patent is extended or adjusted under 35 U.S.C. 154(b) by 0 days.

(21) Appl. No.: 13/371,616

(22) Filed: Feb. 13, 2012

(65) Prior Publication Data

US 2013/0212547 A1 Aug. 15, 2013

(51) Int. Cl.
*G06F 17/50* (2006.01)

(52) U.S. Cl.
USPC ............................. 716/119; 716/118; 716/123

(58) Field of Classification Search
USPC .................................. 716/118, 119, 122, 123
See application file for complete search history.

(56) References Cited

U.S. PATENT DOCUMENTS

| | | | | |
|---|---|---|---|---|
| 6,086,625 A * | 7/2000 | Shouen | .......................... | 716/103 |
| 6,519,756 B1 * | 2/2003 | Kao et al. | ...................... | 716/103 |
| 7,100,124 B2 * | 8/2006 | Cooke et al. | .................. | 716/104 |
| 7,114,139 B2 * | 9/2006 | Kabuo | .......................... | 716/114 |
| 7,707,532 B1 * | 4/2010 | Padalia et al. | ................. | 716/119 |
| 2008/0120582 A1 * | 5/2008 | Wang et al. | ....................... | 716/5 |
| 2008/0244490 A1 * | 10/2008 | Nakatake et al. | ................. | 716/9 |

* cited by examiner

*Primary Examiner* — Vuthe Siek

(74) *Attorney, Agent, or Firm* — James Cai; Shein & Cai LLP

(57) ABSTRACT

A method is directed to automatic extraction of block binders before block placement and application of block binders in block placement of an integrated circuit. Having block binders reduces the effective block count the block placement has to handle, and enables obtaining better placement result in shorter run time. The method includes an algorithm of processing the nodes of a hierarchical net-list to identify candidate nodes or create new candidate nodes to contain identified nodes. The method includes an algorithm of extracting a block binder out of blocks under each candidate node. The method includes an algorithm of automatic packing and generation of various configurations for a block binder to provide flexibility in block placement. The method also includes adapting any block placement algorithm to select to the best fit configuration of any block binder during the placement process.

16 Claims, 12 Drawing Sheets

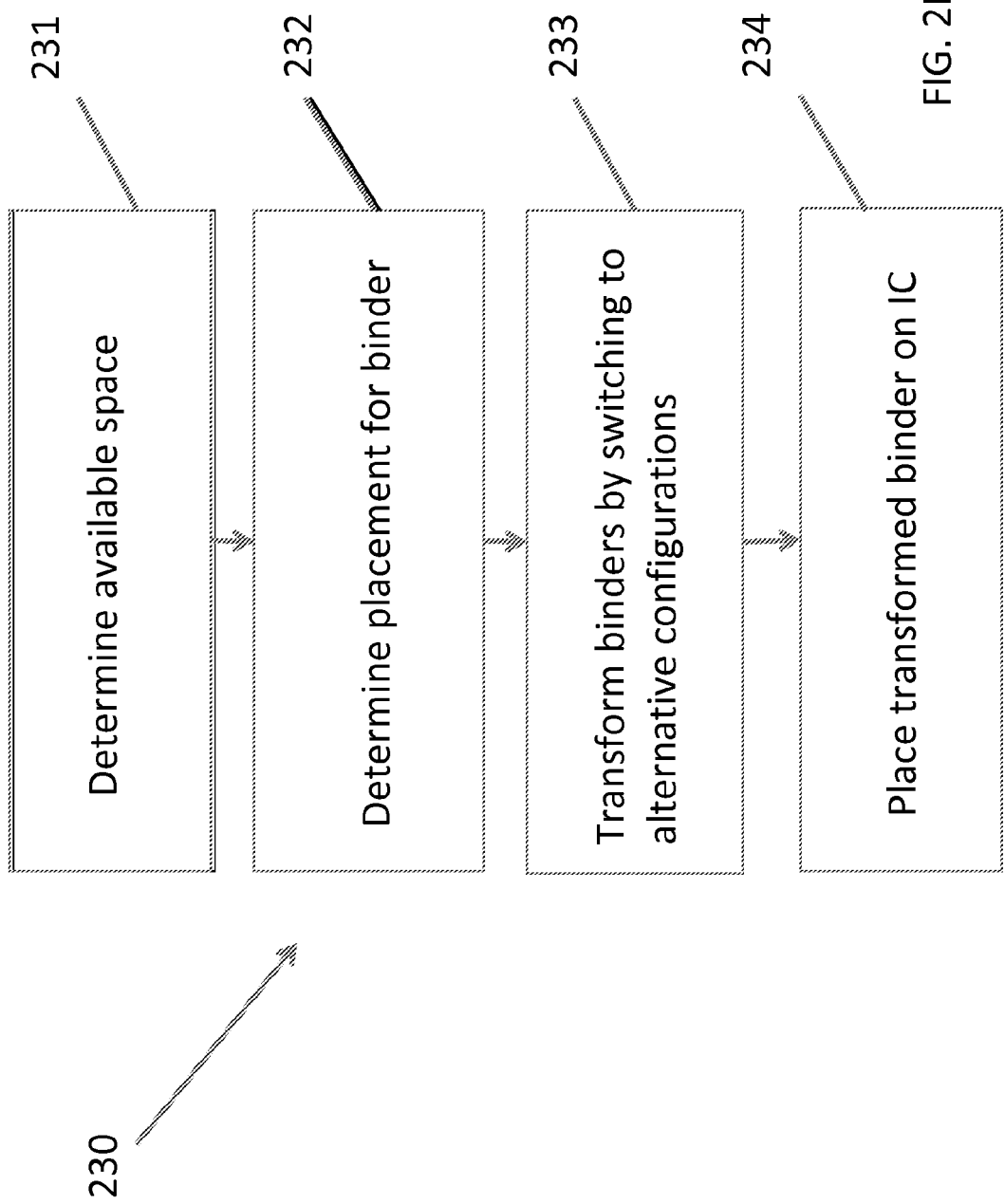

US 8,661,390 B2

METHOD OF EXTRACTING BLOCK BINDERS AND AN APPLICATION IN BLOCK PLACEMENT FOR AN INTEGRATED CIRCUIT

FIELD OF THE INVENTION

The present disclosure is directed to methods of manufacturing an integrated circuit. More particularly, in the present disclosure there is provided a method of extracting block binders from blocks (or macro cells) by analyzing logic structure of the integrated circuit and applying the extracted block binders during the layout process of manufacturing the integrated circuit.

BACKGROUND OF THE RELATED ART

Layout for an integrated circuit is known. Placement of layout for an integrated circuit is known. Block placement for an integrated circuit is also known. However, the block placement algorithms are limited and need improvements. It would be advantageous to include block binder (a set of relatively fixed blocks) extraction before placement algorithm in a ready manner during the manufacture of an integrated circuit.

Essentially, a manual creation of the relative placement of circuits (in any form or syntax) is known. However, an automatic extraction of block binders of the same or different masters, each having multiple configurations, and the application of block binders into any block placement algorithms is lacking in the integrated circuit manufacturing arts. The automatic extraction greatly enhances usability and productivity of users while achieving better performance in the integrated circuit design process.

SUMMARY OF THE INVENTION

According to the first aspect of the present disclosure, there is provided a method. This method is directed to block placement of a logic circuit in an integrated circuit. The method includes automatically extracting block binders before block placement based on an algorithm and utilizing the extracted block binders for placing the blocks in the integrated circuit.

In another embodiment of the present disclosure, there is provided a method that further comprises transforming a block binder by switching to an alternative configuration of the block binder that is the best fit to available placement space near given proximity in the integrated circuit.

In another embodiment of the present disclosure, there is provided a method that includes determining a plurality of block binders with each of the block binders having multiple configurations and storing the block binders in a memory and automatically selecting one configuration for each block binder from the memory during manufacture to place the blocks in the integrated circuit.

According to another embodiment of the present disclosure, there is provided a method that includes executing a placement algorithm that is capable of handling block binders and receiving the block binders and switching to alternative configurations during manufacturing to place the blocks in the integrated circuit.

According to a further embodiment of the present disclosure, there is provided a method that includes processing a net-list into a plurality of nodes, wherein each node represents a module and each edge represents a parent-child relationship of nodes.

According to another embodiment of the present disclosure, there is provided a method that includes preparing a net-list, wherein the nodes of said net-list comprise a plurality of blocks and standard cells and information of their dimensions.

According to a further embodiment of the present disclosure, the method also further comprises processing the nodes to identify or create 'candidate' nodes for the subsequent block binder extraction.

In another aspect, the method further comprises skipping child nodes and processing the nodes that are already marked as candidates for extraction and extracting the block binders by receiving the candidate from the processing phase and creating the block binders.

In another aspect, the method includes differently processing the nodes by extracting a same-master (hereinafter S-M) block binder or a different-master (hereinafter D-M) block binder, or extracting an S-M block binder that comprises two to sixty-four blocks, or extracting an S-M block binder that comprises an N by M matrix, wherein the matrix is formed with N rows and M columns and forms a rectangle that is closest to a square in overall dimensions.

In another aspect, the method also includes extracting an S-M block binder that comprises an N/2×M*2 matrix, wherein the matrix is formed by N/2 rows and 2*M columns or extracting an S-M block binder that comprises a 2*N×M/2 matrix, wherein the matrix is formed by doubling the N rows of the matrix and by reducing the M columns to half, or forming a plurality of matrices, wherein each matrix is formed by assuming the blocks are all in up-right orientation and executing an orientation optimization process upon each matrix to try at least four non-rotating orientations, wherein the ordering of blocks in the matrix is also optimized. Each matrix becomes one configuration of the S-M block binder. A block binder may have multiple configurations. Various configurations are possible and within the scope of the present disclosure.

In another aspect of the present disclosure, the method also includes extracting a D-M block binder that comprises two to sixteen blocks, or extracting a two-block D-M block binder that comprises a 1×2 matrix, wherein the matrix is formed with one row and two columns by applying an orientation optimization on the matrix, or extracting a D-M block binder that comprises a 2×1 matrix, wherein the matrix is formed with two rows and one column. Each matrix becomes a configuration of the D-M block binder.

In another aspect of the present disclosure, there is provided a method that includes extracting D-M block binders of three or more blocks that form a plurality of aspect ratios, wherein the variety of aspect ratios are formed so that the block placement algorithm can switch to an alternative configuration with a significantly different aspect ratio to fit into available placement space, and optionally the method may include forming an aspect ratio (overall height/overall width) of about 1.0, or forming an aspect ratio of about 0.5, wherein the resulting configuration is wider than its height, or forming an aspect ratio of about 0.33, wherein the resulting configuration is even wider than its height, or forming an aspect ratio of about 2.0, wherein the resulting configuration has its height being larger than its width, or forming an aspect ratio of 3.0, wherein the resulting configuration has its height even taller than its width, or manually creating the D-M block binder.

In another aspect of the present disclosure, the method may include manually forming at least one configuration into the block binders, or skipping at least one block that is already in an existing block binder, or disbanding at least one block binder before the automatic block binder extraction or block placement, or providing a graphical user interface that allows manual creation of the block binders and optionally changing a default configuration of at least one block binder.

In a further aspect of the present disclosure, the method may further include executing a block placement algorithm and, for some block binders, executing default configurations and, for other block binders, determining alternative configurations and storing the alternative configurations as the new default configurations for the block binders.

In another aspect of the present disclosure, the method may further include executing a block placement algorithm capable of handling rectilinear shapes of blocks, or handling fixed blocks by not modifying their placement, or respecting orientation constraints on blocks of certain masters, or allocating a placement-blocking shape in the integrated circuit for a predetermined space indicating that the blocks or block binders should not be placed at the predetermined space, or determining that the block binder cannot be placed with the default configuration and applying an alternative configuration for the block binder without overlapping to form a more integral and usable core space for subsequent standard cell placement.

In another embodiment of the present disclosure, there is provided a non-transitory computer-readable medium, operable with a processor, having processor executable instructions. The non-transitory computer-readable computer medium comprises program instructions for placing a plurality of blocks relative to one another to form a block binder and program instructions for automatically extracting the block binder based on an algorithm for placing the blocks in the integrated circuit.

BRIEF DESCRIPTION OF THE FIGURES

The foregoing and other objects, features and advantages of the invention will be apparent from the following more particular description of preferred embodiments of the invention, as illustrated in the accompanying drawings in which like reference characters refer to the same parts throughout different views. The drawings are not meant to limit the invention to particular mechanisms for carrying out the invention in practice, but rather, the drawings are illustrative of certain ways of performing the invention. Others will be readily apparent to those skilled in the art.

FIG. 2D illustrates an embodiment method of handling transformation (switching to an alternative configuration) of block binders in block placement.

DETAILED DESCRIPTION OF THE PREFERRED EMBODIMENTS

Figure 1:
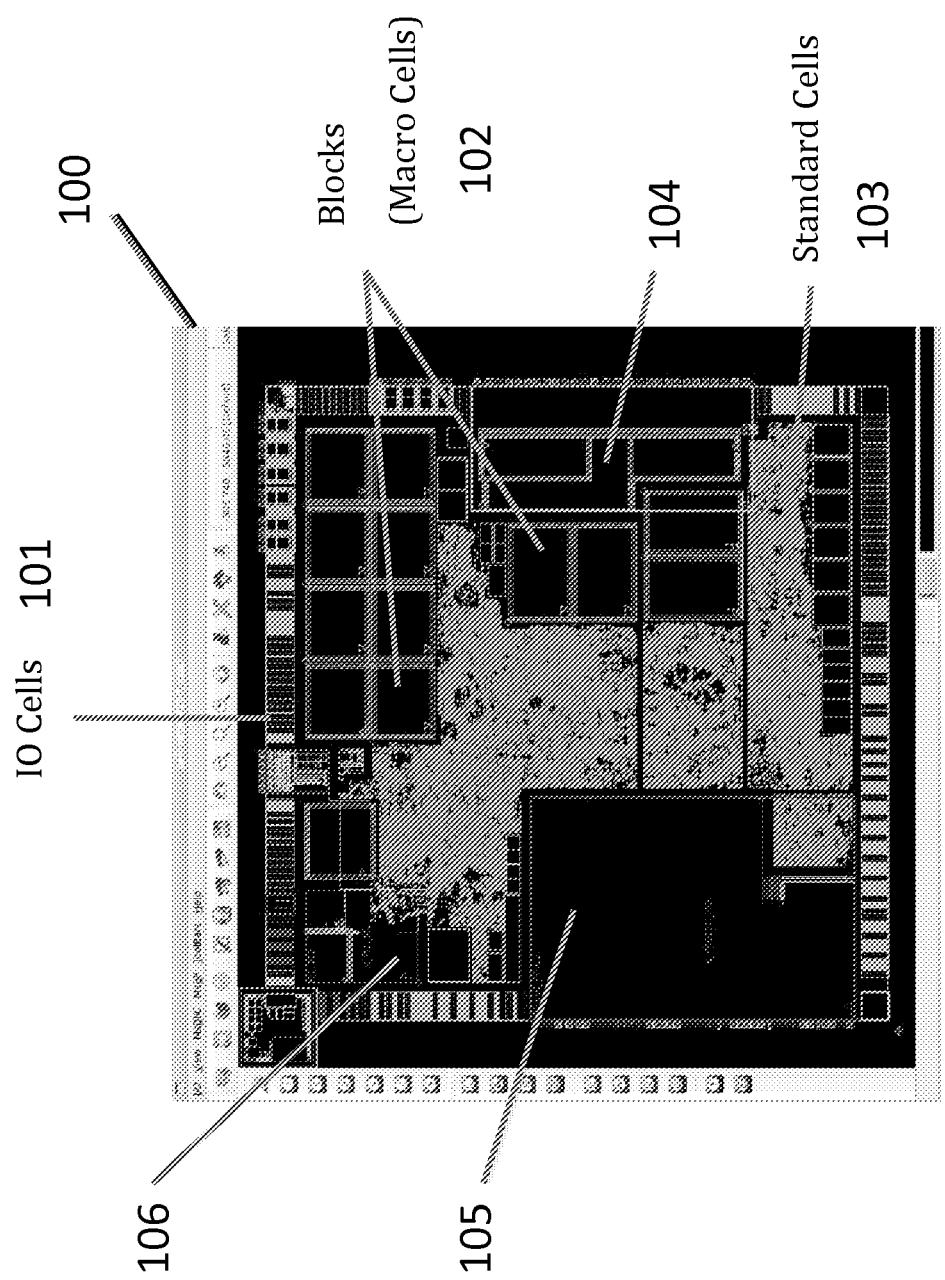
FIG. 1 shows the layout of an integrated circuit having a number of IO cells, blocks and standard cells.

In an integrated circuit layout, devices can be roughly classified into IO cells, blocks (a.k.a. macro cells) and standard cells. The placement of IO cells is dictated by chip packaging. Standard cells are the smallest logic units in integrated circuit (a.k.a. IC) layout. A typical IC today might contain up to twenty millions of standard cells. The placement of standard cells is a complex problem by itself. Blocks are much larger circuits than standard cells. A block could be a RAM (random-access memory), a ROM (read-only memory), an analog custom-drawn circuit, or a digital circuit layout formed by tens of thousands of standard cells (from a hierarchical layout design flow). The placement of these large blocks is the key aspect of the present disclosure.

Nowadays, the number of blocks in an IC can reach as high as 2000. This is a result of widely used local memory design architecture. A traditional larger memory block is divided into many smaller ones and placed locally near standard cells that access them. This enhances the read/write access speed of memory elements.

Even a more traditional IC may contain as many as fifty blocks. When the number of blocks is small, layout engineers may be able to manually place them before placement of standard cells. However, as the number of blocks increases dramatically, this becomes a mission difficult for humans to accomplish. A good placement is one of the keys to manufacture high-speed ICs.

As block count increases dramatically in today's ICs, the complexity of block placement increases exponentially. Existing approaches focus on the algorithm aspect to improve the block placement results. Many academic researches and industrial products of layout systems continue to treat each block individually during the placement process. For example, if one is asked to find the best permutation of three blocks placed in a straight line, the total combinations to try are 3! (=3×2×1=6) before the best solution can be found. However, for two blocks, the total combinations are 2! (=2×1=2). In other words, by adding the third block, the complexity increases by three fold. By the same reasoning, adding the fourth block increases the complexity by four fold and so on. Placing blocks in a 2D plane instead of a straight line and considering all possible orientations increase the complexity exponentially. In other words, it is absolutely critical to reduce the numbers of blocks to speed up the block placement process. In short, block placement is an NP(non-polynomial)-hard problem in term of computational complexity.

A typical IC contains duplicates of logic circuits to implement 'bits' (such as 32-bit or 64-bit architecture in CPUs). Such duplicates in logic structure (a.k.a. net-list) mean that, by extracting groups of blocks from the net-list and optimizing their layout, it is possible to 'bind' multiple blocks into a 'super block', which contains multiple blocks with their relative placement fixed to the first reference block in the group. Such a super block is called a 'block binder' in the present disclosure. A similar advantage can be found if two or more 'highly connected' blocks are bound into a binder. Each block binder is treated as one super block (likely with rectilinear outline) during the block placement process. By extracting block binders from the net-list, the effective block count (individual blocks plus block binders) that the block placement has to handle is reduced dramatically. This block binder extraction reduces effective blocks to be placed since more blocks are bounded into fewer block binders. Therefore, it facilitates the block placement process and enables finding better placement solution given limited amount of time. The present disclosure provides a method of extracting block binders before block placement that enables shorter block placement time and achieving better block placement result utilizing processor executable instructions. However, a block binder is much larger than any of its individual block. This hinders the flexibility of block placement to fit a larger block binder into available limited placement space than placing smaller but more individual blocks. Therefore, the present disclosure also provides a method of extracting multiple configurations (of various aspect ratios and outlines) of a block binder to maintain its flexibility in block placement.

Turning now to FIG. 1, there is shown an integrated circuit 100 that includes a plurality of cells 101, 102, and 103. The cells 101-103 may include input and output cells 101 and rectangular or rectilinear blocks 102 and standard cells 103. Generally, the integrated circuit 100 may be displayed in a graphical user interface. The integrated circuit 100 may include a placement area that is finite. Placement is the process to locate every logic unit in certain orientation in an integrated circuit layout so that many criteria are met and objectives achieved. Such logic units (a.k.a. cells) include I/O cells 101, blocks 102, and standard cells 103. In general, the standard cells may be placed in a plurality of four different non-rotating orientations, while blocks may be placed in a plurality of eight orientations including four rotating ones.

The cells placed at the outer ring locations of the integrated circuit 100 are the I/O cells 101. Those small and densely placed cells in the middle are the standard cells 103. In one embodiment, there may be many more standard cells 103 than other types of cells. The much bigger cells that are also located in the center region (a.k.a. 'core area') are the blocks 102. In one embodiment, a typical design has a few hundreds of I/O cells 101, up to two thousands of blocks 102, and up to tens of millions of standard cells 103. Various different configurations are also possible and within the scope of the present disclosure.

I/O cells 101 may be in range of several hundreds placed in the integrated circuit 100 shown in FIG. 1. Placement of I/O cells 101 (the outer rectangular ring placement in FIG. 1) may be dictated by chip packaging. There are specific software tools that assist placement of I/O cells 101 to meet chip packaging requirements. There are also software tools that place the massive standard cells 103 to meet desired objectives such as timing, congestion, and power consumption. However, before placement of standard cells 103, blocks 102 should be placed first after the placement of I/O cells 101. In other words, in the typical placement process, I/O cells 101 get placed first. The blocks 102 get placed next. Finally, standard cells 103 are placed in the integrated circuit 100. Other variations are also possible and within the scope of the present disclosure.

The objectives of block 102 placement are different from those of standard cells 103 placement. Blocks 102 are much larger than standard cells 103 and in dramatically different sizes and outlines. Typically, blocks 102 have more layers of blockages inside than those of standard cells 103. Therefore, blocks 102 should be placed so that they do not hinder the placement of standard cells 103 while they are still located near their connected cells no matter what types they are. There are many existing algorithms for block placement. Various algorithms are possible and within the scope of the present disclosure.

After placement, a step called 'routing' is performed on the placed cells. Routing means connection of pins (or ports) on the cells together with wires and via without shorting one another while complying with design rules and achieving design intents. Some nets have two pins to connect to while others might have many more depending on the connectivity of the nets.

Combination of placement and routing is called the 'layout' of IC design. Before layout begins, a 'net-list' must exist. In one embodiment, human editing creates the net-lists. In another embodiment, net-lists may be compiled by computer software with human inputs. The software is operable with a processor having processor-executable instructions.

Net-List Hierarchy

A tree-like hierarchy of net-list modules decides the logic function of a chip 100. Each module contains sub-modules, and cells (I/O cells 101, blocks 102, and standard cells 103). Other variations are also possible and within the scope of the present disclosure. Blocks 102 reside in various modules in the net-list hierarchy. It is fairly common that a module contains multiple instantiations of the same sub-module. For example, if a sub-module of a module A contains a block 102, and the sub-module is instantiated for thirty-two times, there are thirty-two blocks in this module A under thirty-two similar sub-modules. Sub-modules under the same module are more likely to be highly connected than sub-modules under different modules. Blocks of the same module are more likely to be highly connected (directly or indirectly) than blocks of different modules.

Shapes of Blocks

Blocks 102 can be very big or very small and may have different sizes and the blocks 102 can be of rectangular or rectilinear shapes. In FIG. 1, the blocks on the middle-right side 104, lower-left 105 and the upper-left corners 106 are all rectilinear blocks. Such blocks 104-106 cannot be treated as rectangular blocks because doing so wastes lots of placement area unnecessarily. Some big blocks contain their proprietary I/O ports. This is common for some analog blocks to isolate high-speed noise coming from digital logic units. Such blocks are considered as fixed during block placement. Two of the blocks mentioned above (the middle-right 104 and lower-left 105 in FIG. 1) are not place-able blocks since they have dedicated IO ports inside and are considered as fixed by most placement algorithms.

Survey of Prevailing Solutions

The difficulty of block placement comes from the fact that blocks can be big (as big as tens of thousands of standard cells) or small (as small as tens of standard cells) or rectilinear shapes as mentioned above. This difficulty escalates when the area percentage of blocks is high (says, more than 40% of core area, where standard cells 103 and blocks 102 are to be placed). Trying to fit all sizes and shapes of blocks into the core area while leaving nice and integral space for subsequent standard cell 103 placement and achieving block 102 placement objectives has been a very challenging problem to solve. Most prevailing industrial block placement solutions provide location guidance only and expect users to further manually place the blocks with human intelligence. In the past, there were usually fewer than twenty blocks in a design. Human could manage the placement of ten to twenty blocks. Nowadays, there may be up to 2000 blocks, while designs that contain fifty blocks are very common. Human have a challenging placement task to complete, not to mention optimizing such a task.

Figure 3A:
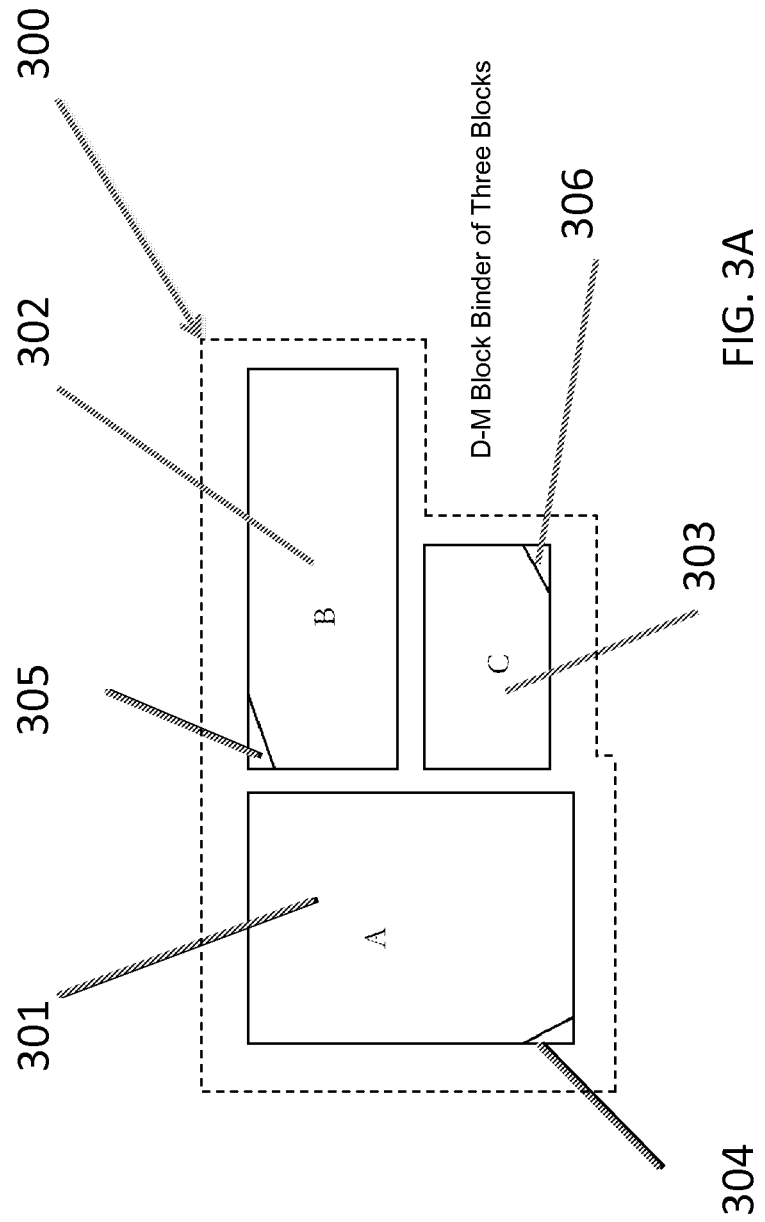
FIG. 3A shows a D-M block binder and its rectilinear outline formed by three different blocks.

Prevailing industrial solutions of block 102 placement allow user intervention in the form of relative placement constraints. Users are allowed to specify a set of blocks 102 to be placed in a relative manor. FIG. 3A depicts such a relative placement constraint of block A, B, and C 301-303. Each block 301-303 includes a predetermined size and logic components and a predetermined orientation.

In FIG. 3A, the small cut lines 304-306 at the corners represent the orientations of the blocks to be placed relatively. The entire relative placement in FIG. 3A is a block binder. To a block placement algorithm that can handle block binders, the block binder 300 can be rotated and flipped as an entity. Their relative locations and orientations do not change. Essentially, the block binder is a new super block 300 consists of three original blocks 301-303 inside and has a rectilinear outline shape.

Relative placement constraint like the above conveys intents of users to be implemented. Users deem this setup as the optimal placement of these three blocks. Therefore, placement algorithms should respect those design intents. However, as we explained above, imposing such relative placement constraints is troublesome and tedious to users even if they really know how those blocks should be placed, which they often don't. Users hope to be independent as much as possible of such design-related information in order to complete their tasks. The present disclosure automates the creation of such block binders 300.

Figure 2A:
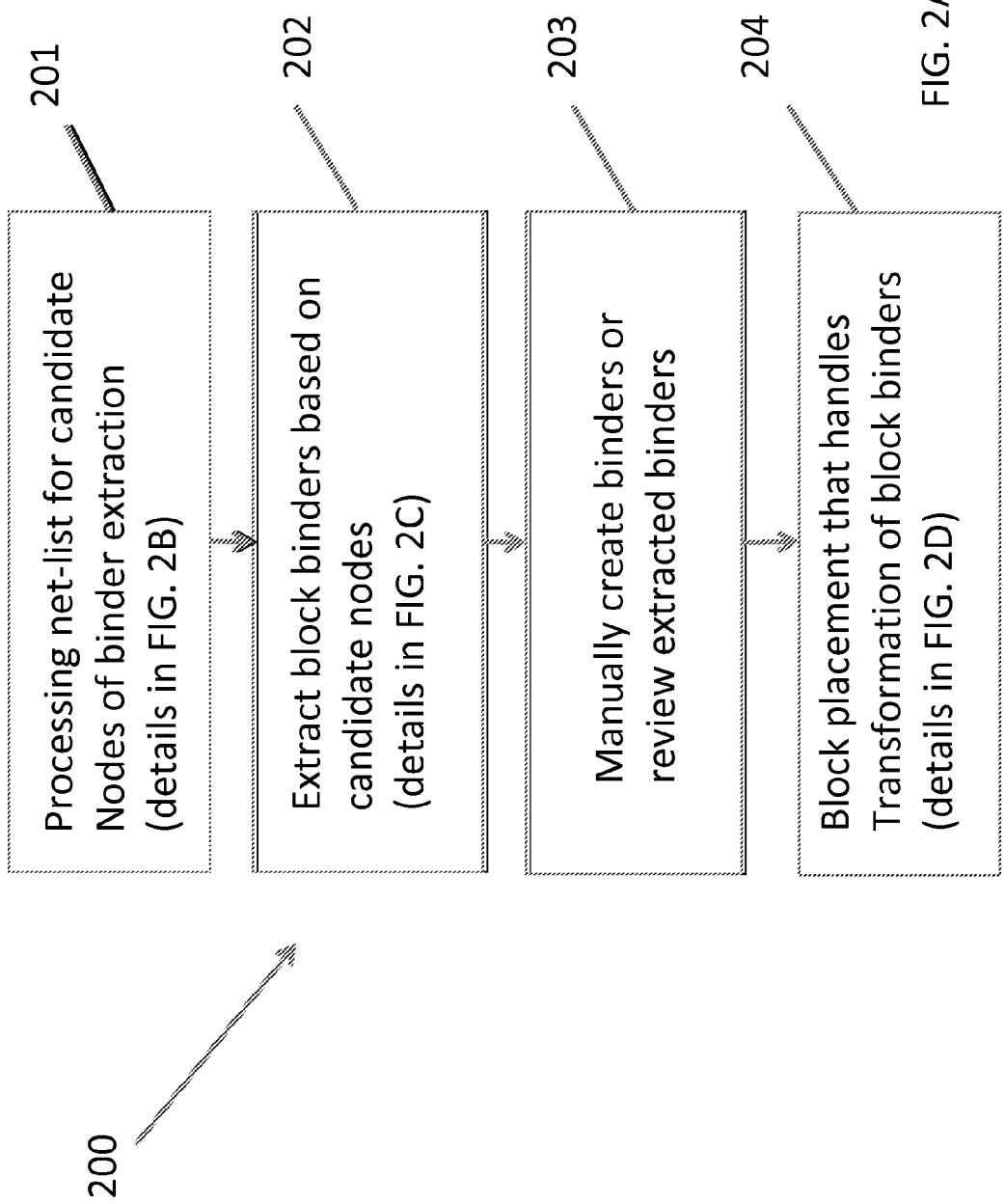
FIG. 2A illustrates an embodiment method according to a flow chart of the present disclosure for extracting block binders and placement of the block binders according to the present disclosure.
Figure 2B:
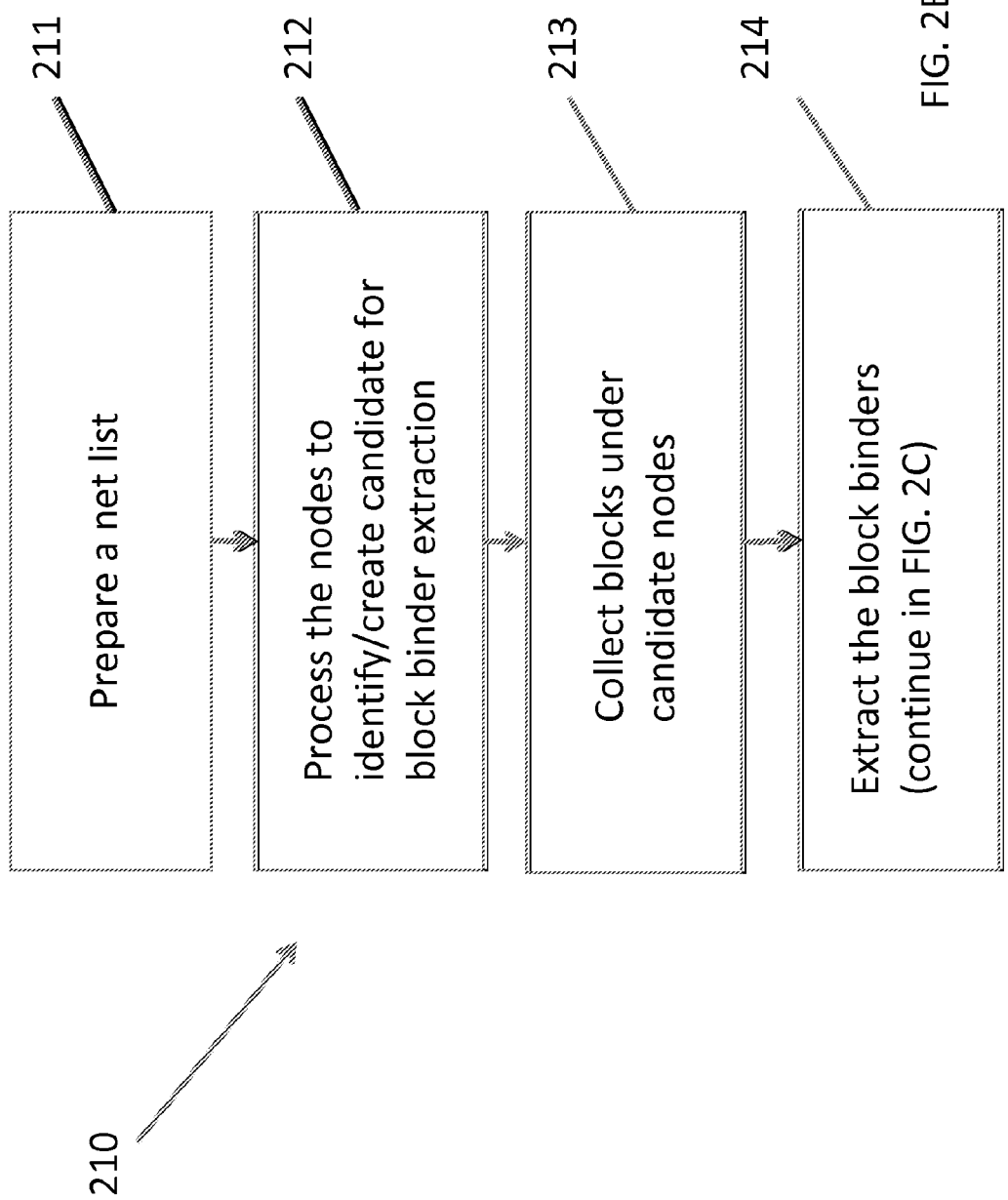
FIG. 2B illustrates an embodiment method of processing a net-list to identify or create candidate nodes for block binder extraction.
Figure 2C:
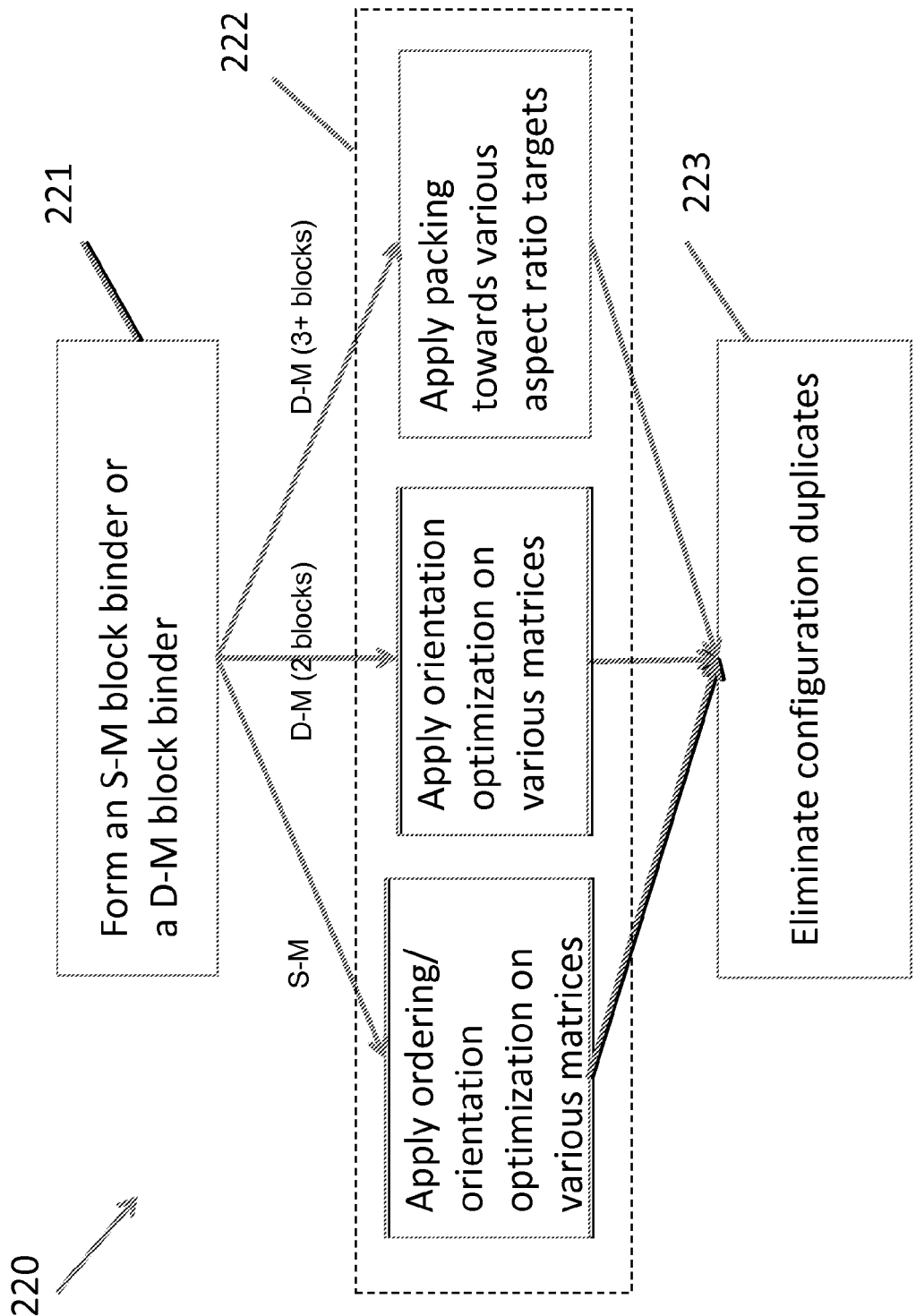
FIG. 2C illustrates an embodiment method of extracting block binders based on candidate nodes identified or created.

Turning now to FIG. 2, there is shown a flow chart of a method 200 according to the present disclosure. Method 200 is operable on a computing device having a processor having processor-executable instructions. Method 200 commences at step 201 where each node of the net-list is processed to be identified as a candidate of block binder extraction. More details are shown in FIG. 2B. At step 202, a block binder is extracted for each node identified as a candidate at step 201. More details are shown in FIG. 2C. At step 203, users may want to visually inspect the extracted block binders, disband some, or define new block binders manually. At step 204, the block binders are fed into a placement algorithm that is capable of handling block binders and transforming them to alternative configurations if that gives better placement result. More details are shown in FIG. 2D.

Turning now to FIG. 2B, there is shown a flow chart of a method 210 according to the present disclosure on how net-list is processed for block binder extraction. Method 210 is operable on a computing device having a processor having processor-executable instructions. At step 211, a net-list is processed into a tree of nodes, where each node represents a module in the net-list. At step 212, each node is evaluated to see if it is a candidate for extraction of block binders. Several nodes might be merged under a newly created candidate node at this step. At step 213, all blocks under each candidate node from step 212 and its child nodes are collected into a set. At step 214, a block binder is created out of each set of blocks collected at step 213. More details on step 214 are shown in FIG. 2C.

Turning to FIG. 2C, there is shown a flow chart of a method 220 according to the present disclosure on how block binders are extracted from the processed net-list. At step 221, an S-M block binder or a D-M block binder is created depending on whether the set of blocks have the same master (S-M) or not (D-M). For each block binder, multiple configurations are evaluated as described below. At step 222, for an S-M block binder, ordering and orientation optimizations are run on various matrices. For a D-M block binder with two blocks, an orientation optimization is run on various matrices. For a D-M block binder with three or more blocks, a packing algorithm is employed to generate multiple configurations towards various target aspect ratios. At step 223, the resultant configuration is checked against existing configurations of the block binder for duplication. Duplicates are eliminated to save run time of block placement.

Turning to FIG. 2D, there is shown a flow chart of a method 230 according to the present disclosure on how block binders are handled in block placement algorithm. At step 231, available space for placing block binders are evaluated. At step 232, an approximate location for a block binder is computed. At step 233, all configurations of a block binder is evaluated to see which one fits available space the best near the designated location. At step 234, the best fit configuration is chosen and properly orientated to place this block binder.

Figure 3B:
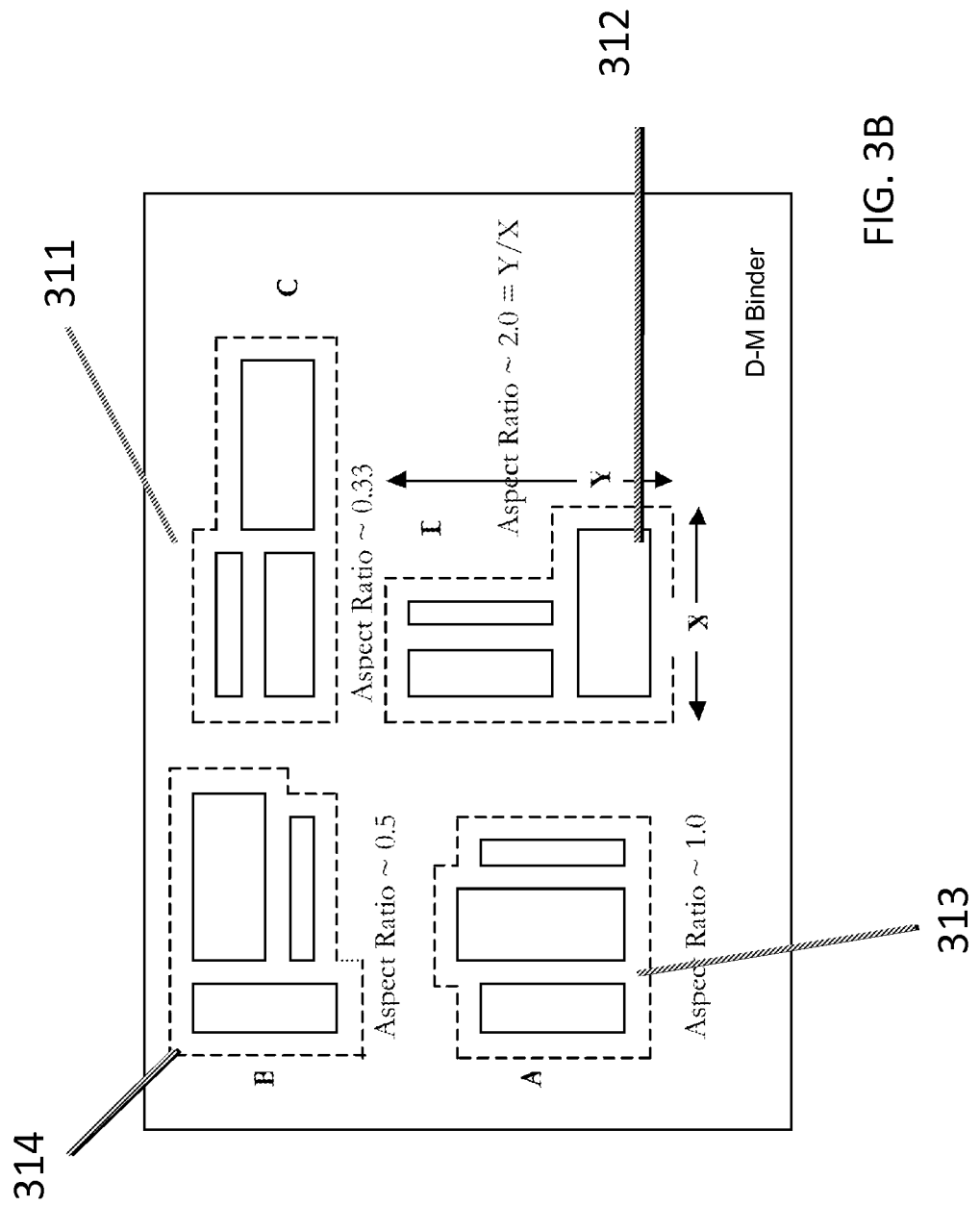
FIG. 3B shows a D-M block binder illustrating four different configurations of various overall aspect ratios and outlines.

Turning to FIG. 3B, it illustrates a D-M block binder of three blocks and its four different configurations 311-314, each with significantly different overall aspect ratio and outline from another. More configurations are possible and not limited by the examples in FIG. 3B.

Figure 3C:
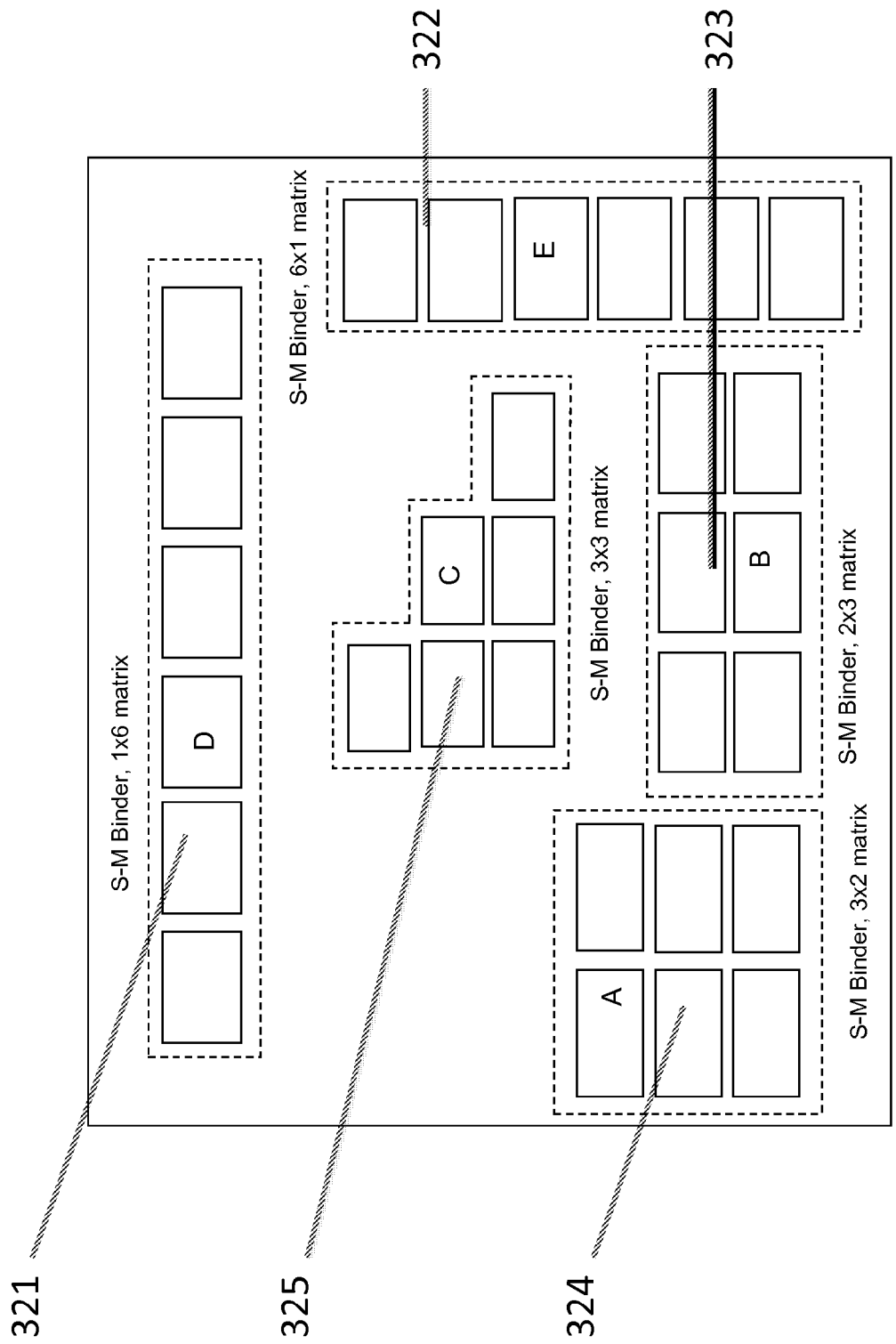
FIG. 3C shows an S-M block binder illustrating five configurations of different matrix formats, which are equivalent to various aspect ratios and outlines of a D-M block binder.

Turning to FIG. 3C, it illustrates an S-M block binder of six blocks of the same master and its five configurations 321-325, each with significantly different overall aspect ratio and outline from another. More configurations are possible and not limited by the examples in FIG. 3C.

Figure 4A:
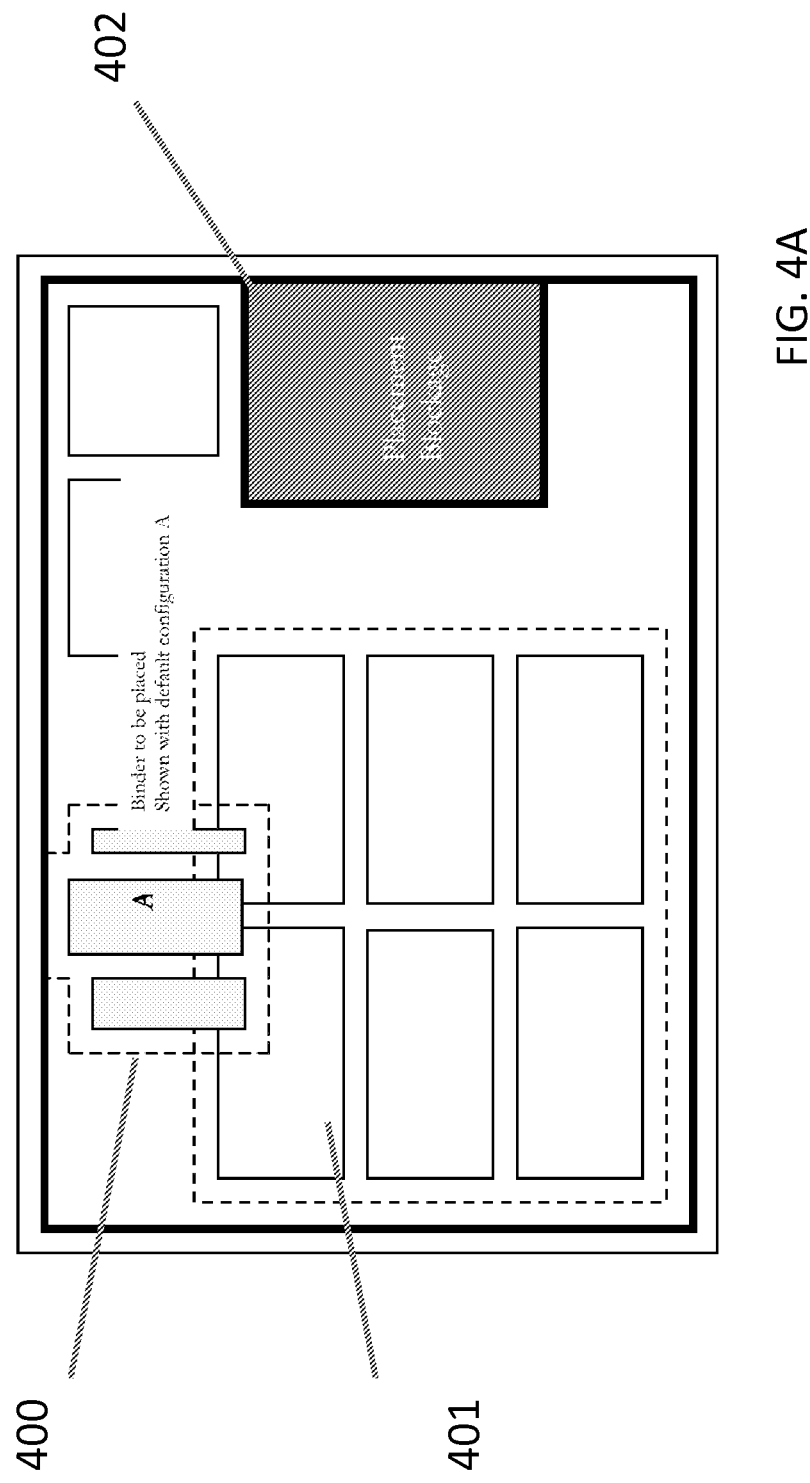
FIG. 4A illustrates an integrated circuit schematic with a D-M block binder with default configuration being placed.
Figure 4B:
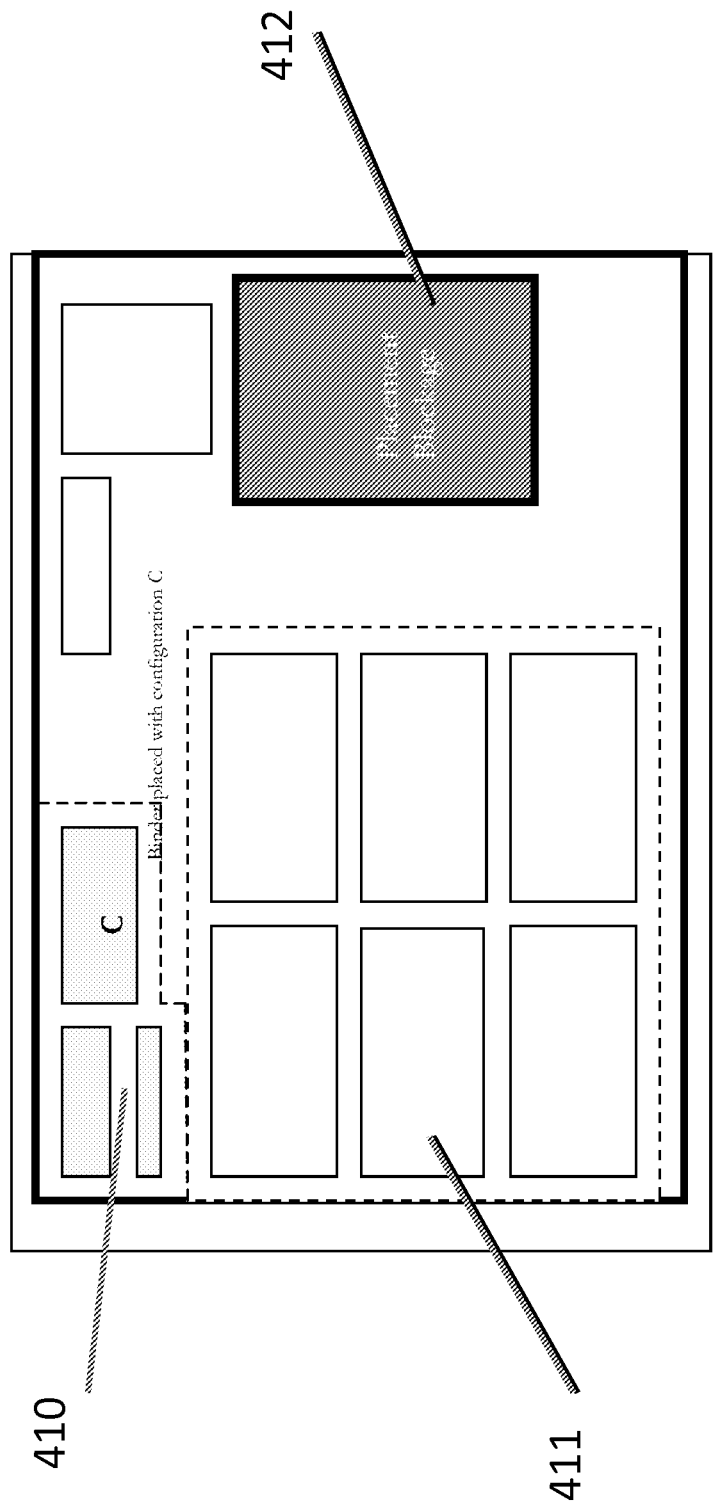
FIG. 4B illustrates an integrated circuit schematic with the best fit alternative configuration of the placed D-M block binder.

Turning to FIG. 4A, it illustrates a placement situation where a D-M block binder 400 (in yellow) with configuration A (or 313 as in FIG. 3B) needs to be placed near it present location with limited empty space. Turning to FIG. 4B, by switching to an alternative configuration C (or 311 as in FIG. 3B), the placement algorithm is able to place the said block binder without causing overlap with other placed blocks or block binders.

Figure 4C:
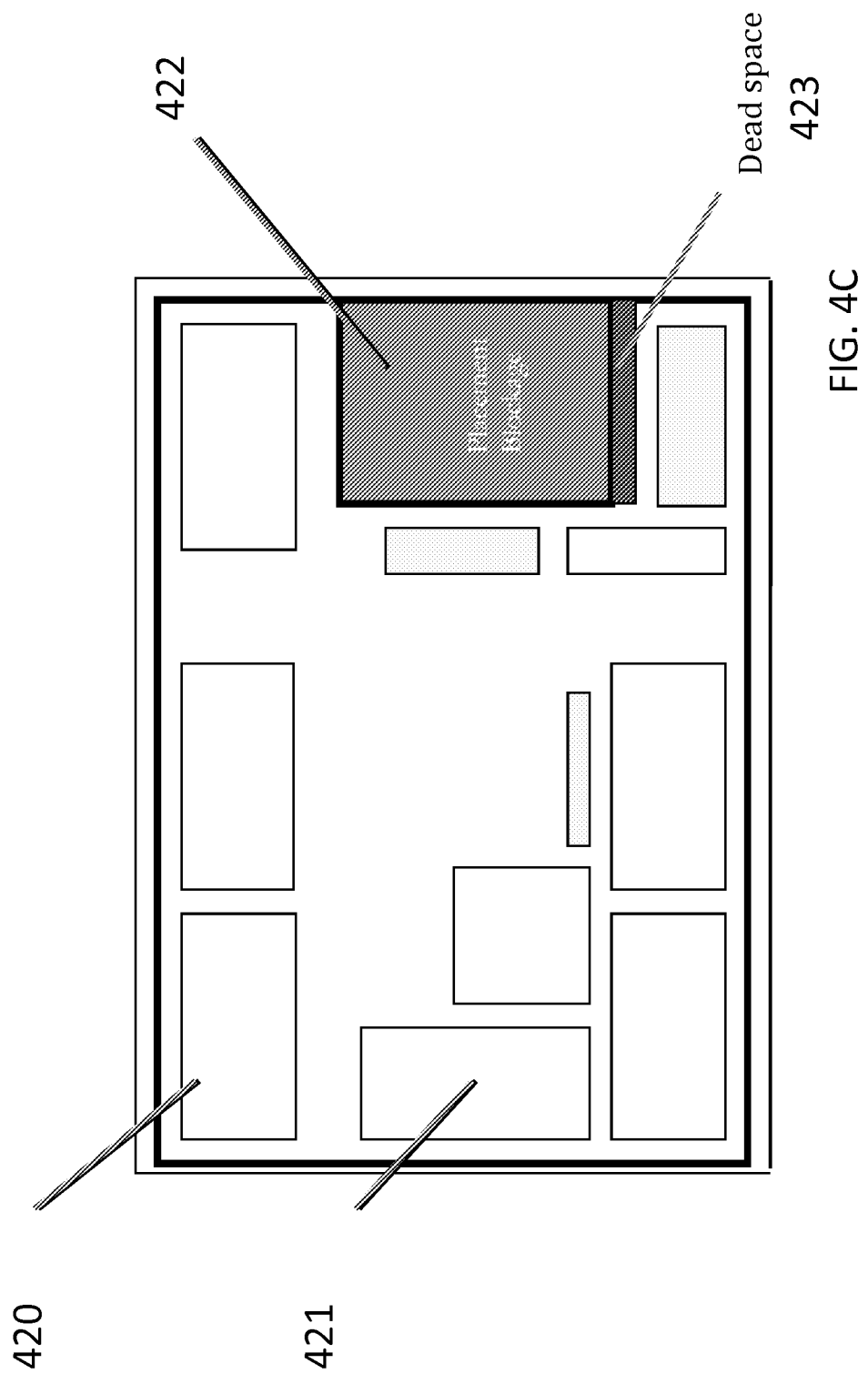
FIG. 4C illustrates an integrated circuit schematic without any block binder present with all blocks are placed individually by block placement.

Finally, turning to FIG. 4C, it illustrates placement result if there is no block binder present for the block placement. It is apparent that this block placement seems less organized and more chaotic, which likely to be proven less desirable at the end of standard cell placement.

Automatic Extraction of Block Binders

The method of block binder extraction is as follow and is shown in FIG. 2B. Method 210 is operable in a computing device having a processor with processor executable instructions for the operation of the method 210. Method 210 commences at step 211 for the preparation of a net list.

Preparation of Net-list: A processor may prepare the hierarchy of net-list modules into a graph of nodes and edges. Each node represents a module, and each edge represents a parent-child relationship between two modules. The processor may process the new graph so that each node contains its corresponding module's standard cells and blocks (excluding fixed cells and blocks that are already in pre-existing block binders—such as from user's creation). The processor may process each node so that it also contains information about how many blocks/how much block area and standard cell area below it (meaning all its child nodes).

Processing the Nodes: The processor may traverse the graph (from step 211) to visit all the nodes. At each node, if any one of the following criteria is true, the processor may mark the node as a 'candidate' for block binder extraction and skip all its child nodes at step 212. The processor may also create a new candidate node and put identified nodes under it. Note that at each node, nodes that are already marked as candidates for extraction are excluded in subsequent percentage computation.

(1) The processor may scan the node tree from top. At each node A, collect its child nodes if the area ratio R=(block area)/(total cell area) is larger than a preset value (says, 75%) and they each contain one or two same-master blocks into a set B. The processor may analyze this set B of child nodes. The processor may sort the set B by master type and may scan the set B to collect all child nodes of the same master into set C at step 213.

If the total count of blocks (definitely same-master) is between two to K, a preset number (says, sixty-four), then the processor may create a new node A' to contains these nodes in C. The processor may mark this new node A' as a candidate for extraction, and skip all its child nodes. The processor may continue to scan set B for a new set C' in the same-wise. Note that in this step, connectivity is not considered. Having blocks of the same master and high area ratio may be two main or important criteria. In another embodiment, other criteria may be evaluated.

Blocks of the same master under the same parent node with high area-ratio R is an indication that they are from multiple instantiations. Other indications are also possible. By nature, they are highly associated and should be placed closely together. This step enables creation of S-M (same-master) block binders with block count from two to sixty-four.

(2) After scanning the entire node tree, the processor may rescan the node tree from top. At each node A, the processor may collect its child nodes C that has higher area ratio R than a preset value (says, 60%) and if the processor determines that each node C contains the same or different master blocks (not limited to two blocks as in step 1) into set B. Other preset values are possible and within the scope the present disclosure. For each node C in B, the processor may trace its connectivity and collect its 'highly connected' (explained below) peer nodes Ds (also in set B).

If such peer nodes (Ds) are found (one or more) and the total block count (combining blocks under nodes C and Ds) is less than L (a preset number, says sixteen), the processor may create a new node E to contain C node and Ds nodes. The processor may store and mark this new node E as a candidate for extraction, and skip all its child nodes. The processor may continue to trace other nodes in set B excluding blocks that are already collected in connectivity analysis. This enables creation of D-M (different-master) block binders with block count from two to sixteen.

(3) After scanning the entire node tree in step (1) and (2), the processor may re-scan the node tree from top. At each node A, the processor may collect its child nodes that contain only one block regardless of the area ratio R (defined above) into a set B. For each node C in set B, the processor may trace its connectivity to find another 'highly connected' node D (also in set B). The processor may create a new candidate node E to contain nodes C and D. Sine both node C and D have only one block, the new node E has exactly two blocks. The processor may continue to scan set B for another C and D pair in the same manner. The processor connectivity analysis may exclude those blocks that are already under newly created candidate nodes. This enables creation of D-M (different-master) block binders with block count exactly equals two. Note that this step is different from step (2) in that no area ratio is considered and extracted block binders have exactly two blocks.

Nodes (or blocks) are considered as 'highly connected' if high or predetermined percentage of interface pins are connected to one another directly or indirectly through standard cells. In general, if the percentage is larger than N %, N is a preset number (says, twenty-five), they are considered as 'highly connected' to one another. Various other values are also possible and within the scope of the present disclosure.

Block binder extraction: The processor may include an extraction of block binders at step 214. After the processing phase above, the extraction of block binders is now described. Each node in the graph that is marked as a candidate from the processing phase is one block binder to be extracted. Nodes marked by various steps in the previous processing phase are extracted differently. The extraction process can be divided into two cases, S-M block binder and D-M block binders, as shown in FIG. 2C, at step 221.

S-M Block Binder (two to K blocks): (typical K is sixty-four) There may be two to K blocks of the same master in this candidate node. Various configurations are extracted for this S-M block binder.

N×M Matrix: The matrix is formed by N rows and M columns that make the matrix closest to being a square in overall dimensions.

N/2×M*2 Matrix: The matrix is formed by reducing the rows to N/2 and by increasing columns to 2*M. This process continues until N/2=1, i.e. a 1×M*N matrix. Multiple configurations could be extracted into this block binder.

N*2×M/2 Matrix: The matrix is formed by doubling the rows while reducing columns to half. The process keeps going until M/2=1, i.e. an M*N×1 matrix. Multiple configurations may be extracted into this block binder. Other configurations are also possible and within the scope of the present disclosure.

As a result of the above three ways of configuration extraction, multiple configurations are usually formed for this block binder. Initially all blocks are in up-right orientation in each matrix. At step 222 (of FIG. 2C), an ordering optimization process is executed upon each matrix to optimize the positions of blocks. An orientation optimization process is then executed upon each matrix to try all the four non-rotating orientations (two orientations are from flipping left-right, and two orientations are from flipping up-down to equal four non-rotating orientations). The orientation optimization has to respect orientation constraints if any. If users impose those orientation constraints before block binder extraction, the extraction algorithm also needs to respect the constraints. An objective of ordering and orientation optimization is for the processor to minimize total wire length (or, connection length of all nets associated with the blocks in the matrix) among blocks of the block binder. Each matrix forms a configuration into the S-M block binder. Finally, duplicates of configurations are eliminated at step 223. At the end, this S-M block binder may have multiple (at least one) configurations that are mutually different from one another. FIG. 3C depicts a case where there are five different configurations of the six-block S-M block binder. Various sizes and orientations are also possible and within the scope of the present disclosure.

Note that certain configurations such as the ones from matrices N*M×1 and 1×N*M could be too large in one dimension to fit in the core area where the block binder is to be placed. Such configurations are useless for block placement and thus removed from the block binder. Under special circumstance, if no valid configuration exist based on the previous matrices, additional matrices (configuration 325 in FIG. 3C) are evaluated such as (N+1)×(M−1) and (N−1)×(M+1), etc. to generate at least one valid configuration for the S-M block binder.

D-M Block Binder (two to L blocks): (typical L is sixteen) Step (2) and (3) in processing phase could produce a candidate node with two blocks of different masters. The extraction processes for block binders of two blocks and block binders of three or more blocks are different. In either case, a block binder is created for each candidate node, and various configurations are extracted as below:

For block binders of two blocks:

1×2 Matrix: The matrix is formed with one row and two columns. An orientation optimization (step 222 in FIG. 2C) is applied on the matrix and with non-rotating orientations only. This step creates one configuration for this block binder.

2×1 Matrix: As above, the matrix is formed with two rows and one column. Similar non-rotating orientation optimization is applied (step 222 in FIG. 2C). This step creates a different configuration from that of the previous matrix.

1×2 Matrix: Same matrix as the previous step, but this time all eight possible orientations are allowed (including four rotating orientations) (step 222 in FIG. 2C). This matrix might create a different configuration than the previous two, but might also be the same. Note that a similar matrix starting with a 2×1 matrix is not required since they both cover the same solution space with different orientations. In the same wise, an ordering optimization is not required for a D-M block binder of two blocks. The resulting block binder likely has two to three configurations. Configuration duplicates are eliminated in the D-M block binder.

For block binders of three to L blocks: (typical L is sixteen)

A D-M block binder is extracted for this candidate node with three or more blocks. It is computational intensive to attempt all possible orientations of each block and all possible relative positions for each block in a 2D plane. By doing so, there might be too many (hundreds or thousands of) configurations created for the D-M block binder. Many configurations of block binders cause dramatic slowdown during block placement when the processor tries all configurations of all block binders. For practical purpose, what is needed is having sufficient configurations that cover wide variety of aspect ratios so that any reasonable block placement algorithm can switch to an alternative configuration to fit into available placement space (see FIG. 4A and FIG. 4B). Therefore, the configuration extraction procedure has to respect the provided aspect ratio target.

A packing algorithm is essentially what is needed for this configuration extraction step (step 222 in FIG. 2C). A packing algorithm is a block placement algorithm in much smaller scale that is capable of respecting (or trying to achieve) the target aspect ratio of configuration (such as the one in FIG. 3A, which has an aspect ratio of close to 0.5) while optimizing overall wire length and creating a configuration that is as compact as possible. Various packing algorithms are possible and within the scope of the present disclosure Aspect Ratio=1.0: By instructing the packing algorithm to produce a configuration with target aspect ratio of 1.0, the resulting configuration should resemble a square.

Aspect Ratio=0.5: By instructing the packing algorithm to produce a configuration with target aspect ratio of 0.5 (=1/2), the resulting configuration should be wider than its height. (Similar to that of FIG. 3A)

Aspect Ratio=0.33: By instructing the packing algorithm to produce a configuration with target aspect ratio of 0.33 (=1/3), the resulting configuration should be even wider than its height.

Aspect Ratio=2.0: By instructing the packing algorithm to produce a configuration with target aspect ratio of 2.0 (=2/1), the resulting configuration should be taller than its width.

Aspect Ratio=3.0: By instructing the packing algorithm to produce a configuration with target aspect ratio of 3.0 (=3/1), the resulting configuration should be even taller than its width.

As a result of exploring all of those aspect ratios, the D-M block binder might contain up to five different configurations.

As before, similar configurations are eliminated before the configurations are created into the block binder. FIG. 3B depicts a case where there are four different configurations of the three-block D-M block binder. A first configuration 314 has aspect ratio close to 0.5. A second configuration 311 has aspect ratio close to 0.33. A third configuration 312 has aspect ratio close to 2.0. A fourth configuration 313 has aspect ratio close to 1.0. As shown, the configuration 313 includes a first dimension X (overall width) and a second dimension Y (overall height), based on which the aspect ratio is defined by Y/X. Various sizes and orientations are also possible and within the scope of the present disclosure.

Manual Creation of Block Binders

Knowledge of users if available is advantageous when it comes to integrated circuit layout process. Therefore, users should be allowed to manually create block binders and variable configurations into the block binders. Automatic extraction process should optionally skip those blocks that are already in any existing block binders, user-defined or not. If they choose to do so, users may disband some block binders before the automatic block binder extraction or block placement. In the layout system pertaining to the present disclosure, there are several easy-to-use graphic user interfaces (GUIs) that allow users to manually create block binders and their configurations. A GUI may include a visual display of various configurations of a block binder and/or set certain configuration in a block binder as the default one.

Default Configurations of Block Binders

A default configuration is the first configuration of a block binder that the block placement algorithm should observe. If switching configurations is not allowed by users in block placement, the default configuration is the only legitimate configuration of a block binder to use in the block placement process. Any block binder must contain at least one configuration. The first configuration in database usually is the default one, and is the one being displayed in graphical user interface. When the block placement determines that an alternative configuration is the best fit for the block binder, it must set this alternative configuration as new default before the block placement terminates. This is to maintain consistency of GUI drawing and database.

Application of Block Binders in Block Placement

As depicted in FIG. 3A-3C, a configuration of a block binder usually makes the outlines of the block binder rectilinear. In other words, a block placement algorithm may be capable of handling rectilinear blocks before it can handle block binders. Taking the overall bounding box of blocks in a block binder is too wasteful in placement space and is less preferable in real world applications.

Assuming that for the block binder in FIG. 3B, the default configuration is the one with aspect ratio ~1.0 (configuration 313 or A). At the decision point to place this block binder into available placement space, having multiple configurations becomes critical and useful. Turning now to FIG. 4A, there is shown a default configuration A (or element 313 in FIG. 3B) for a block binder 400 along with a placement blockage area 402 and an already placed S-M block binder 401 (configuration 324 or A in FIG. 3C) in 3×2 matrix format.

In FIG. 4A, it shows the block binder 400, which cannot be placed with the default configuration 313 (in FIG. 3B). If users disallow switching to an alternative configuration of the block binder 400, it is impossible to find a legal placement without any overlap. With multiple configurations, the block placement algorithm can switch the block binder 400 to configuration 311 (or C as shown in FIG. 3B) and flip it up side down to create more integral core space for subsequent standard cell placements. In FIG. 4B, it illustrates a final placement of the block binder 410 (same as block binder 400 in FIG. 4A) after configuration change from 313 (A) to 311 (C) as depicted in FIG. 3B.

From FIG. 4A-B, it is apparent that multiple configurations of block binder 400 in FIG. 4A (or 410 in FIG. 4B) provides the flexibility needed to compensate the negative of having a fixed shape and larger block binder while keeping the advantages of having block binders to reduce effective block count to speed up block placement process and achieving better placement. Multiple configurations enable shape transformation when available space is tight for a block binder to place. The present disclosure provides a block binder extraction of closely related or highly connected blocks before block placement begins. The advantage is that the blocks in block binders stay together throughout the block placement process. A block binder is moved and rotated together as an entity. By combining blocks into block binders, the block placement deals with fewer effective blocks making it more likely to obtain better placement result.

FIG. 4C depicts a possible outcome of block placement when there is no block binder present in the design. The drawbacks of not having block binders are that the S-M block binder of six blocks (401 in FIG. 4A, 411 in FIG. 4B) is now broken and placed irregularly (two of the six are 420 and 421). This might create difficulty in meeting routing and timing requirements. Additionally, some fragmented dead space (red area 423 in FIG. 4C) can be seen in the final placement and an original D-M block binder (in FIG. 4A and FIG. 4B) of three blocks is now broken also and placed separately by some distance. This usually is not preferable from layout perspective and is usually confirmed after the standard cell placement that follows the block placement.

Dead space is more likely to show up when more effective blocks are to be placed in block placement due to typical order-dependent sequential packing. As mentioned previously, block binder extraction dramatically reduces effective block count for block placement to handle. The block placement deals with eleven blocks in FIG. 4C. With two block binders extracted, the same block placement deals with only four effective blocks (nine blocks in two block binders plus two individual blocks) in FIG. 4A-B. Therefore, the likelihood of having dead space with block binder extraction is greatly reduced. Multiple configurations of block binders make it even less likely to happen in final block placement.

FIGS. 3A-3C and 4A-4C illustrate extra space surrounding a block which is the reserved space for sake of pin accessibility. During block placement it is not feasible for the method to abut in a block to block manner since some pins of blocks might not be accessible for routing. Therefore, an aspect is to manually or automatically reserve extra space for each block on each side depending on how many pins there are on that side of block. The present disclosure provides a method to automatically compute the space required on each side of a block for pin accessibility.

Figure 5:
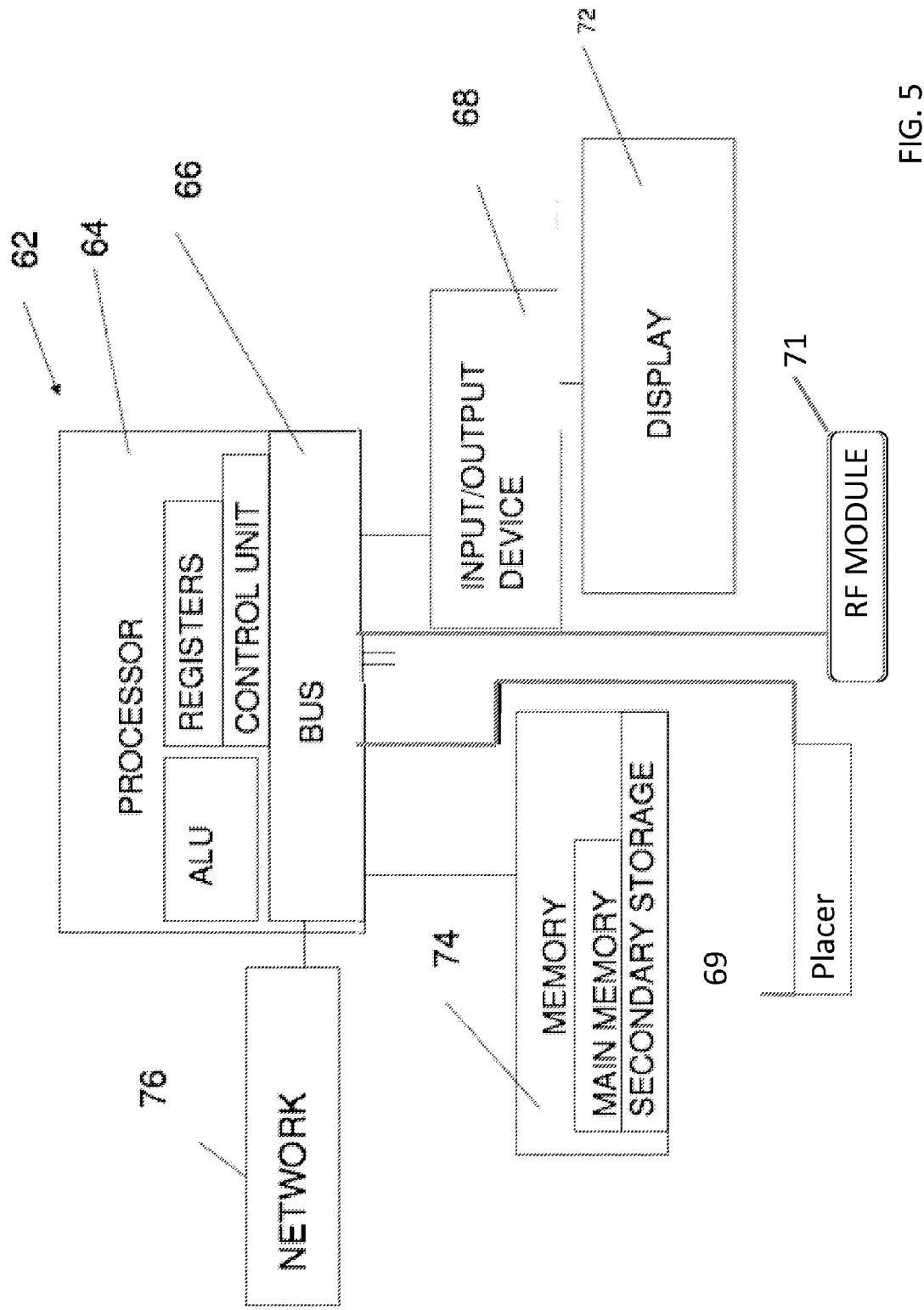
FIG. 5 illustrates a general-purpose computer according to one non-limiting embodiment of the present disclosure.

FIG. 5 illustrates a high level schematic view of the computer device that includes a manufacturing device for an integrated circuit and a placer 69 and a radiofrequency (RF) module 71, which are connected to a bus 66. Through the RF module 71, the bus is connected to a network 76. The computer device also includes a processor 66 including an ALU unit, registers and a control unit 64 and 66. The computer device also includes a memory 74 that includes a main memory and a secondary storage. The computer device also includes an input device 68 and a display 72.

To automatically extract block binder 401 of same master or block binder 400 of different masters (in FIG. 4A) with multiple configurations before block placement is beneficial, and advantageous in IC layout design process. C++ program may provide benefit along with a different software program. The present software program provides an automatic extraction of block binders, each with multiple configurations and the application of block binders into any block placement algorithms. Reducing effective block count greatly speeds up block placement process and enables better placement results in shorter run time.

Generally, in operation, the computer system operable with that method shown in FIGS. 1-5 is controlled by an operating system. Typical examples of operating systems are MS-DOS, Windows95, 98, 2000, XP, Vista and Windows 7 from Microsoft Corporation, or Solaris and SunOS from Sun Microsystems, Inc., UNIX based operating systems, LINUX based operating systems, or the Apple OSX from Apple Corporation. As the computer system operates, input such as input search data, database record data, programs and commands, received from users or other processing systems, are stored on storage device. Certain commands cause the processor to retrieve and execute the stored programs. The programs executing on the processor may obtain more data from the same or a different input device, such as a network connection. The programs may also access data in a database for example, and commands and other input data may cause the processor to index, search and perform other operations on the database in relation to other input data. Data may be generated which is sent to the output device for display to the user or for transmission to another computer system or device. Typical examples of the computer system are personal computers and workstations, hand-held computers, dedicated computers designed for a specific purpose, and large main frame computers suited for use many users. The present disclosure is not limited to being implemented on any specific type of computer system or data processing device.

It is noted that the present disclosure may also be implemented in hardware or circuitry, which embodies the logic, and processing disclosed herein, or alternatively, the present disclosure may be implemented in software in the form of a computer program stored on a computer readable medium such as a storage device. In the later case, the present disclosure in the form of computer program logic and executable instructions is read and executed by the processor and instructs the computer system to perform the functionality disclosed as the disclosure herein. If the present disclosure is embodied as a computer program, the computer program logic is not limited to being implemented in any specific programming language. For example, commonly used programming languages such as C, C++, and JAVA as well as others may be used to implement the logic and functionality of the present disclosure. Furthermore, the subject matter of the present disclosure is not limited to currently existing computer processing devices or programming languages, but rather, is meant to be able to be implemented in many different types of environments in both hardware and software.

Furthermore, combinations of embodiments of the disclosure may be divided into specific functions and implemented on different individual computer processing devices and systems, which may be interconnected to communicate and interact with each other. Dividing up the functionality of the disclosure between several different computers is meant to be covered within the scope of the disclosure.

While this disclosure has been particularly shown and described with references to a preferred embodiment thereof, it will be understood by those skilled in the art that is made therein without departing from the spirit and scope of the disclosure as defined by the following claims.

What is claimed is:

1. A method of block binder extraction and its application to block placement of an integrated circuit, the method comprising:
automatically extracting the block binders before block placement based on an algorithm that analyzes a net-list of the integrated circuit;
packing a plurality of blocks relative to one another to form a configuration of the block binder before block placement;
preparing a net-list, wherein the net-list comprises a plurality of blocks and a block area for each of the blocks and further comprising dimensions of standard cells, wherein the net-list comprises a plurality of nodes, and wherein each node represents a module, and each edge represents a parent-child relationship between two modules;
processing the nodes in net-list to determine or create candidate nodes for the block binder extraction, comprising:
for each node determining if the node is a candidate node:
merging several nodes under a new candidate node;
storing candidate node data; and
skipping child nodes if a node is marked as a candidate;
processing the nodes that are already marked as candidates for extraction, comprising:
extracting the block binders by receiving the candidate nodes from the processing phase and creating a block binder for each candidate node; and
differently extracting the candidate nodes based on master types
extracting an S-M (same-master) block binder or a D-M (different-master) block binder;
extracting an S-M block binder that comprises two to sixty-four blocks; and
extracting a configuration of the S-M block binder that comprises an N/2×M*2 matrix, wherein the matrix is formed by N/2 rows and 2*M columns; and repeating until N/2 equals 1.0.

2. The method of claim 1, further comprising:
extracting a configuration of the S-M block binder that comprises an N×M matrix, and wherein the matrix is formed with N rows and M columns, wherein the N×M matrix forms a rectangle that is close to a square in overall dimension.

3. A method of block binder extraction and its application to block placement of an integrated circuit, the method comprising:
automatically extracting the block binders before block placement based on an algorithm that analyzes a net-list of the integrated circuit;
packing a plurality of blocks relative to one another to form a configuration of the block binder before block placement;
preparing a net-list, wherein the net-list comprises a plurality of blocks and a block area for each of the blocks and further comprising dimensions of standard cells, wherein the net-list comprises a plurality of nodes, and wherein each node represents a module, and each edge represents a parent-child relationship between two modules;
processing the nodes in net-list to determine or create candidate nodes for the block binder extraction, comprising:
for each node determining if the node is a candidate node:
merging several nodes under a new candidate node;
storing candidate node data; and
skipping child nodes if a node is marked as a candidate;
processing the nodes that are already marked as candidates for extraction, comprising:
extracting the block binders by receiving the candidate nodes from the processing phase and creating a block binder for each candidate node; and
differently extracting the candidate nodes based on master types;
extracting an S-M (same-master) block binder or a D-M (different-master) block binder;
extracting an S-M block binder that comprises two to sixty-four blocks; and
extracting a configuration of the S-M block binder that comprises a 2*N×M/2 matrix, wherein the matrix is formed by doubling the N rows of the matrix and by reducing the M columns to half; and repeating until M/2 equals 1.0.

4. A method of block binder extraction and its application to block placement of an integrated circuit, the method comprising:
automatically extracting the block binders before block placement based on an algorithm that analyzes a net-list of the integrated circuit;
packing a plurality of blocks relative to one another to form a configuration of the block binder before block placement;
preparing a net-list, wherein the net-list comprises a plurality of blocks and a block area for each of the blocks and further comprising dimensions of standard cells, wherein the net-list comprises a plurality of nodes, and wherein each node represents a module, and each edge represents a parent-child relationship between two modules;
processing the nodes in net-list to determine or create candidate nodes for the block binder extraction, comprising:
for each node determining if the node is a candidate node:
merging several nodes under a new candidate node;
storing candidate node data; and
skipping child nodes if a node is marked as a candidate;
processing the nodes that are already marked as candidates for extraction, comprising:
extracting the block binders by receiving the candidate nodes from the processing phase and creating a block binder for each candidate node; and
differently extracting the candidate nodes based on master types;
extracting an S-M (same-master) block binder or a D-M (different-master) block binder;
extracting an S-M block binder that comprises two to sixty-four blocks; and
forming a plurality of matrices, wherein each matrix is formed by assuming a predetermined number of blocks are in an up-right, un-rotated and an un-flipped default orientation.

5. The method of claim 4, further comprising: executing an ordering optimization process upon each matrix; and executing an orientation optimization process upon each matrix to simulate at least four non-rotating orientations.

6. The method of claim 5, further comprising:
minimizing total wire length among blocks in the matrix; and
eliminating duplicates of configurations in extracted S-M block binder.

7. A method of block binder extraction and its application to block placement of an integrated circuit, the method comprising:
- automatically extracting the block binders before block placement based on an algorithm that analyzes a net-list of the integrated circuit;
- packing a plurality of blocks relative to one another to form a configuration of the block binder before block placement;
- preparing a net-list, wherein the net-list comprises a plurality of blocks and a block area for each of the blocks and further comprising dimensions of standard cells, wherein the net-list comprises a plurality of nodes, and wherein each node represents a module, and each edge represents a parent-child relationship between two modules;
- processing the nodes in net-list to determine or create candidate nodes for the block binder extraction, comprising:
  - for each node determining if the node is a candidate node:
    - merging several nodes under a new candidate node;
    - storing candidate node data; and
    - skipping child nodes if a node is marked as a candidate;
  - processing the nodes that are already marked as candidates for extraction, comprising:
    - extracting the block binders by receiving the candidate nodes from the processing phase and creating a block binder for each candidate node; and
    - differently extracting the candidate nodes based on master types;
- extracting an S-M (same-master) block binder or a D-M (different-master) block binder;
- extracting a D-M block binder that comprises two to sixteen blocks;
- extracting a configuration of the two-block D-M block binder that comprises a 1×2 matrix, wherein the matrix is formed with one row and two columns; and
- applying an orientation optimization on the matrix allowing four non-rotating orientations.

8. The method of claim 7, further comprising:
- extracting a configuration of two-block D-M block binder that comprises an 2×1 matrix, wherein the matrix is formed with two rows and one column; and
- applying an orientation optimization on the matrix allowing four non-rotating orientations.

9. A method of block binder extraction and its application to block placement of an integrated circuit, the method comprising:
- automatically extracting the block binders before block placement based on an algorithm that analyzes a net-list of the integrated circuit;
- packing a plurality of blocks relative to one another to form a configuration of the block binder before block placement;
- preparing a net-list, wherein the net-list comprises a plurality of blocks and a block area for each of the blocks and further comprising dimensions of standard cells, wherein the net-list comprises a plurality of nodes, and wherein each node represents a module, and each edge represents a parent-child relationship between two modules;
- processing the nodes in net-list to determine or create candidate nodes for the block binder extraction, comprising:
  - for each node determining if the node is a candidate node:
    - merging several nodes under a new candidate node;
    - storing candidate node data; and
    - skipping child nodes if a node is marked as a candidate;
  - processing the nodes that are already marked as candidates for extraction, comprising:
    - extracting the block binders by receiving the candidate nodes from the processing phase and creating a block binder for each candidate node; and
    - differently extracting the candidate nodes based on master types;
- extracting an S-M (same-master) block binder or a D-M (different-master) block binder;
- extracting a D-M block binder that comprises two to sixteen blocks;
- extracting a configuration of two-block D-M block binder that comprises an 1×2 matrix, wherein the matrix is formed with one row and two columns; and
- applying an orientation optimization on the matrix allowing all eight orientations.

10. The method of claim 9, further comprising: extracting configurations of D-M block binder of three or more blocks by utilizing a packing algorithm.

11. The method of claim 10, further comprising: extracting a configuration of D-M block binder of three or more blocks that forms an aspect ratio of about 1.0.

12. The method of claim 10, further comprising:
- extracting a configuration of D-M block binder of three or more blocks that forms an aspect ratio of about 0.5, wherein the resulting configuration is wider than a height.

13. The method of claim 10, further comprising:
- extracting a configuration of D-M block binder of three or more blocks that forms an aspect ratio of about 0.33, wherein the resulting configuration is wider than a height.

14. The method of claim 10, further comprising:
- extracting a configuration of D-M block binder of three or more blocks that forms an aspect ratio of about 2.0, wherein a resulting configuration has a height being larger than a width.

15. The method of claim 10, further comprising: extracting a configuration of D-M block binder of three or more blocks that forms an aspect ratio of 3.0, wherein a resulting configuration comprises a height taller than a width.

16. A method of block binder extraction and its application to block placement of an integrated circuit, the method comprising:
- automatically extracting the block binders before block placement based on an algorithm that analyzes a net-list of the integrated circuit;
- packing a plurality of blocks relative to one another to form a configuration of the block binder before block placement;
- respecting orientation constraints in block binder extraction and block placement; and
- respecting fixed status of some blocks in block placement and in block binder extraction by being free of including fixed blocks in extraction.

* * * * *